(12) United States Patent
Chang et al.

(10) Patent No.: US 7,119,429 B2
(45) Date of Patent: Oct. 10, 2006

(54) 3-D STACKABLE SEMICONDUCTOR PACKAGE

(75) Inventors: Shu-Ming Chang, Hsinchu (TW); Tzong-Che Ho, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 86 days.

(21) Appl. No.: 11/074,732

(22) Filed: Mar. 9, 2005

(65) Prior Publication Data

US 2006/0027908 A1 Feb. 9, 2006

(30) Foreign Application Priority Data

Aug. 3, 2004 (TW) .............................. 93123227 A (51) Int. Cl.
  *H01L 23/02* (2006.01)
  *H01L 23/48* (2006.01)
(52) U.S. Cl. ..................... 257/686; 257/777; 257/685; 257/E25.013; 257/E25.021

(58) Field of Classification Search ................ 257/777, 257/685, 686
See application file for complete search history.

(56) References Cited

U.S. PATENT DOCUMENTS

| 5,602,420 | A | * | 2/1997 | Ogata et al. ................. 257/686 |
| 5,818,107 | A | * | 10/1998 | Pierson et al. ............. 257/723 |
| 6,359,340 | B1 | | 3/2002 | Lin et al. |
| 6,611,052 | B1 | | 8/2003 | Poo et al. |
| 2005/0098869 | A1 | * | 5/2005 | Shiozawa .................... 257/686 |

* cited by examiner

*Primary Examiner*—Jasmine Clark
(74) *Attorney, Agent, or Firm*—Rabin & Berdo, P.C.

(57) ABSTRACT

A 3-D stackable semiconductor package includes a first component and a second component. The semiconductor package is formed by stacking the back of the first component and the back of the second component together. The metal pads on the surfaces of the first component and the second component are redistributed to the edge of the first and the second components by a redistribution layer. A plurality of electric conduction posts is formed at the edge of the first and the second component to transmit electric signals between them. The semiconductor package transmits electric signals to the PCB by the electric conductive bumps.

10 Claims, 9 Drawing Sheets

3-D STACKABLE SEMICONDUCTOR PACKAGE

BACKGROUND OF THE INVENTION

1. Field of Invention

The invention relates to a 3-D stackable semiconductor package, and more particularly to a 3-D stackable semiconductor package combining two components back to back.

2. Related Art

Although the electronic packaging is often seen to be a minor technology of manufacturing semiconductors, it determines the size and the cost of the electronic products, and therefore its importance should not be underestimated.

Electronic packaging includes single chip packaging (SCP) and multi-chip packaging (MCP). MCP includes a multi-chip module (MCM). The MCP, also called 3-D stackable packaging, has became the mainstream of electronic packaging, for it satisfies the demands for small, cheap, and multi-functional electronic products, and therefore lowers the cost and simplifies the process of the MCP.

U.S. Pat. No. 6,359,340 discloses a multi-chip module having a stacked chip arrangement. It stacks chips on a substrate and electrically connects to each chip by wire bonding technology. Although the developed wire bonding lowers the cost, it increases the size of the module.

U.S. Pat. No. 6,611,052 discloses a wafer level stackable semiconductor package. It stacks each chip on a substrate with electric conductive bumps disposed on the surface of the chips to form electric connection. Since this semiconductor package can perform electric tests only after stacking all chips, the whole package is useless if any single chip is disabled.

SUMMARY OF THE INVENTION

Accordingly, the object of the invention is to provide a 3-D stackable semiconductor package including a first component and a second component. The semiconductor package is formed by stacking the back of the first component and the back of the second component together. The metal pads on the surfaces of the first component and the second component are redistributed to the edge of the first and the second components by a redistribution layer. A plurality of electric conduction posts is formed at the edge of the first and the second components to transmit electric signals between them. The semiconductor package transmits electric signals to the PCB by the electric conductive bumps.

The bonding of the first and second components is either wafer-to-wafer, die-to-die, wafer-to-die, or die-to-die bonding.

When the stack of the first component and the second component is die-to-die, two components can be either the same or different semiconductor components. For example, when both components are memory components, the capacity of memory per unit area is doubled, and when the first component is a memory component and the second component is a logic component, the semiconductor package per unit area can work with more functions.

The invention stacks sub-modules after packaging and testing each sub-module having two dies stacked, instead of performing electric tests after all dies are stacked. Productivity is thereby increased. One sub-module can be directly disposed on the PCB for application, and therefore the size of the package is equal to the size of the die.

The semiconductor package in the related art is formed by stacking dies with one die's top surface attached to another one's bottom surface. However, since the top surface of the die may become uneven after several fabrication processes, dies may fail to bond well and become warped after polishing, thus decreasing the bonding reliability of the dies.

In the invention, the dies are polished in advance and then bonded together. The polished dies are bonded back to back to form a symmetrical structure, which also provides a flat bonding interface to prevent structural warping in order to improve the bonding reliability of the dies. Besides, the fabrication process is easy for mass production.

If the components have heat dissipation problems, the first component and the second component can be bonded with metallic material to dissipate heat for better heat conduction ability. A heat conduction pad on the PCB also helps to dissipate heat.

The invention is not limited to the bonding of only two components. Users can stack two components together to form a sub-module, and then stack other components or other sub-modules together with the sub-module to form a 3-D stackable semiconductor package. The adjacent components or sub-modules are electrically connected by corresponding bumps.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
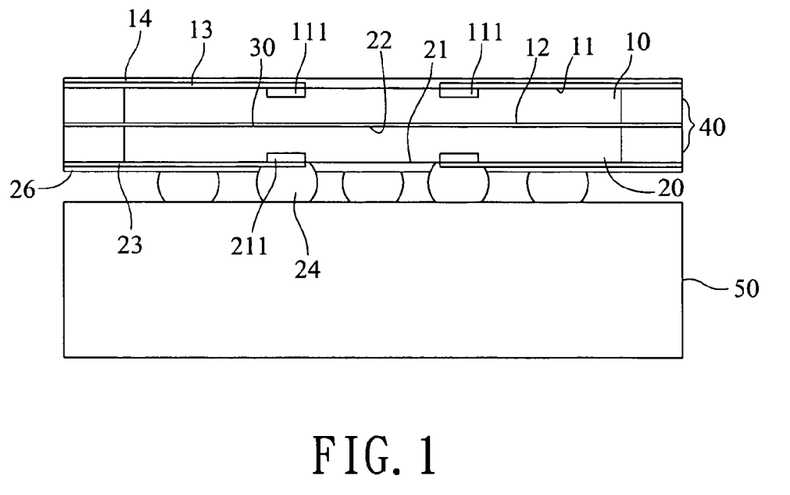
FIG. 1 illustrates a cross sectional view of a 3-D stackable semiconductor package as a first embodiment of the invention.
Figure 2A:
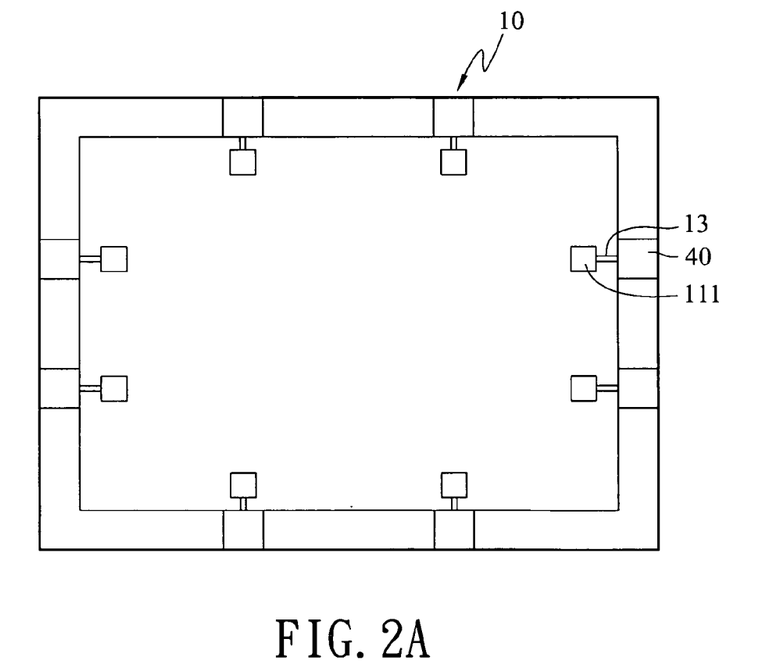
FIG. 2A illustrates a top view of a first component 10.
Figure 2B:
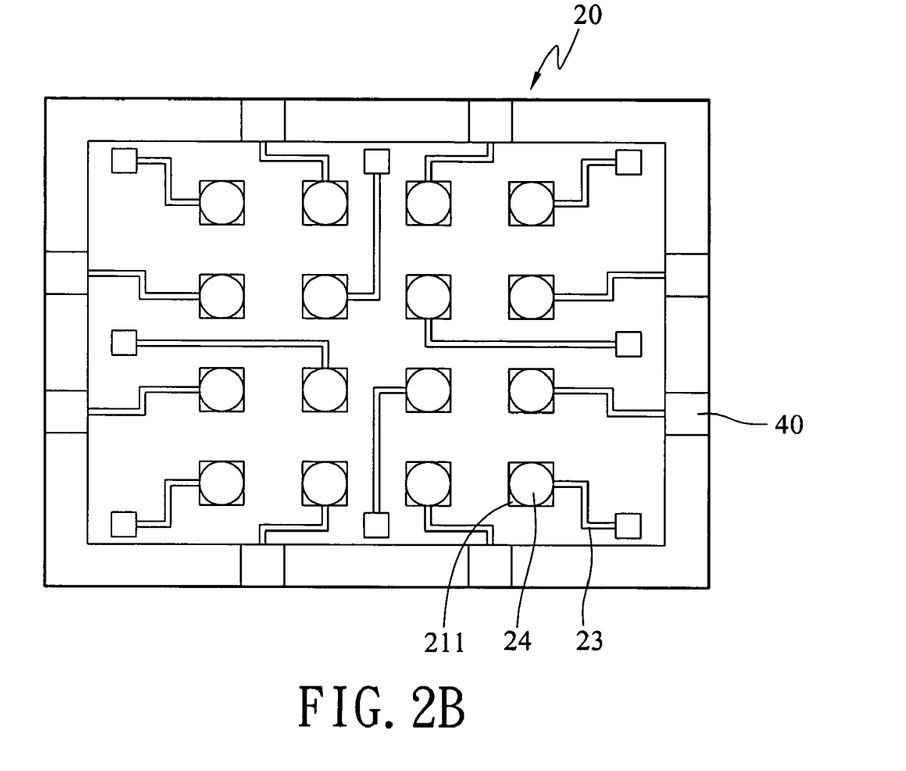
FIG. 2B illustrates a top view of a second component 20.

FIG. 1 illustrates a cross sectional view of a 3-D stackable semiconductor package as a first embodiment of the invention. FIGS. 2A and 2B illustrate a top view of a first component 10 and a second component 20, respectively.

The package stacks the first component 10 and the second component 20 back to back, and redistributes the metal pads, used as I/O ports, disposed respectively on the first component 10 and the second component 20 to the edge of the first and the second components 10 and 20 to electrically connect the two components. The semiconductor package transmits electric signals to the PCB 50 by the electric conductive bumps disposed on the second component 20.

The bonding of the first and second components 10 and 20 is either wafer-to-wafer, die-to-die, wafer-to-die, or die-to-die bonding.

The die is a semiconductor component, such as DRAM, SDRAM, SRAM, EPROM, and so on.

When the stack of the first component 10 and the second component 20 is wafer-to-wafer, two components can be either the same or different semiconductor components, such as both components being memory components, or the first component 10 being a memory component and the second component 20 being a logic component.

The semiconductor package as a first embodiment includes the first component 10, the second component 20, and the electric conduction post 40.

The first component 10 includes a first top surface 11 and a first bottom surface 12 corresponding to each other. At least one first metal pad 111, as an I/O port, disposed on the first top surface 11 is distributed to the edge of the first top surface 11 by a first redistribution layer 13. Then, a first protecting layer 14 made of insulating material is deposited on the top surface of the first component 10 to protect the first component 10 from being damaged.

The second component 20 also includes a second top surface 21 and a second bottom surface 22 corresponding to each other. The second bottom surface 22 is attached to the first bottom surface 12 through an adhesive layer 30, such that the first component 10 stacks on the second component 20. The adhesive layer 30 is made of polymer, metal, or other inorganic materials.

The second top surface 21 also has at least one second metal pad 211 disposed thereon and distributed to the edge thereof by a second redistribution layer 23. Each second metal pad 211 has an electric conductive bump 24 to electrically connect the first and second components 10 and 20 with the PCB 50 beneath. A second protecting layer 26 made of insulating materials is deposited on the top surface of the second component 20 to protect the second component 20 from being damaged.

The electric conduction post 40 is formed at the edge of the first and the second components 10 and 20 to electrically connect the first redistribution layer 13 with the second redistribution layer 23, and thereby the 3-D stackable semiconductor package is formed.

The invention stacks two sub-modules after packaging and testing each sub-module, instead of performing electric tests after all dies are stacked (as in the known art), and productivity is thereby increased.

Figure 3:
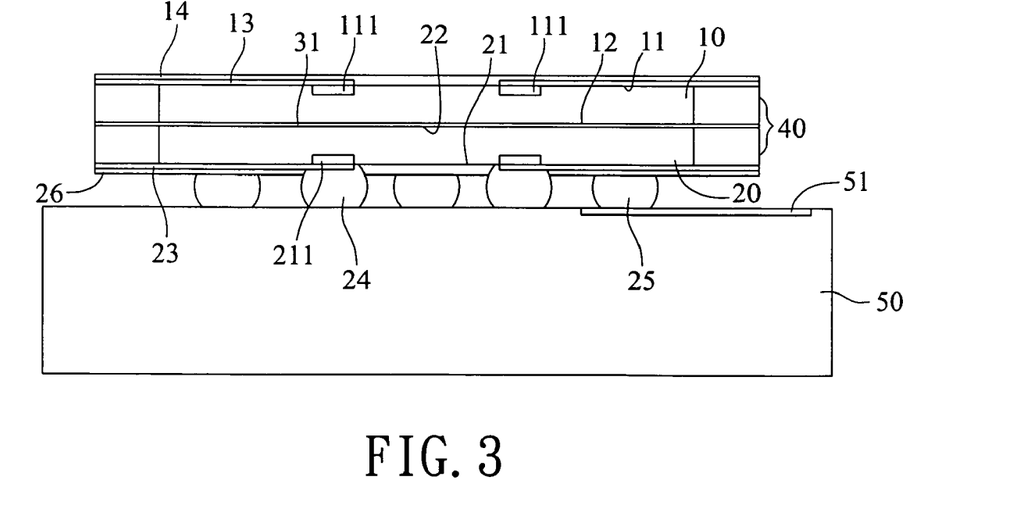
FIG. 3 illustrates a cross sectional view of a 3-D stackable semiconductor package as a second embodiment of the invention.

FIG. 3 is a cross sectional view of a 3-D stackable semiconductor package as a second embodiment of the invention. Referring to FIG. 3, the package of the second embodiment is similar to the first embodiment except with the former a metal layer 31 serves as the adhesive layer 30 of the two components to dissipate heat. Furthermore, a plurality of heat conduction bumps 25 are disposed on the second top surface 21 of the second component 20, attached to the heat conduction pad 51 on the PCB 50 to dissipate heat.

Figure 4:
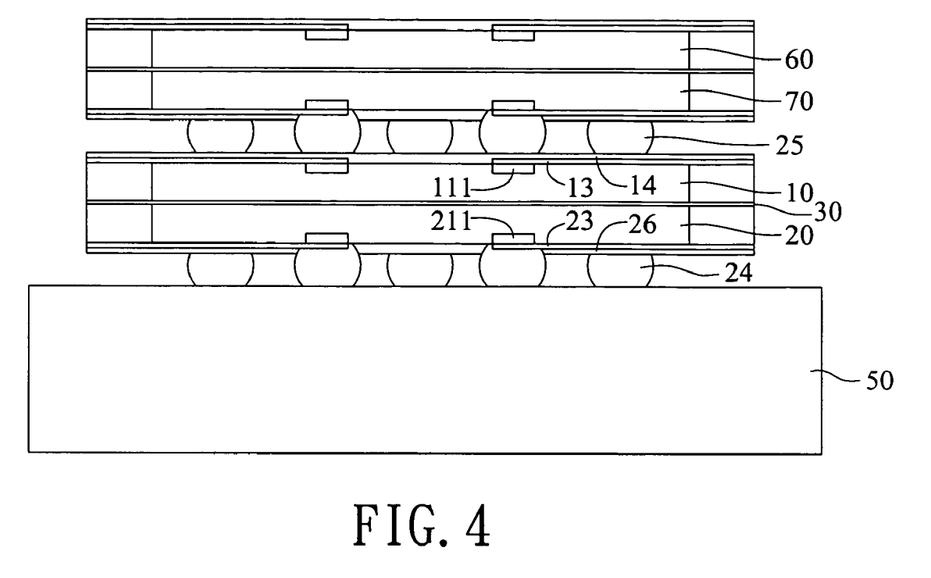
FIG. 4 shows a cross sectional view of a 3-D stackable semiconductor package as a third embodiment of the invention.

FIG. 4 is a cross-sectional view of a 3-D stackable semiconductor package as a third embodiment of the invention. Referring to FIG. 4, a third and a fourth component 60 and 70, which are of the same size as the first and second components 10 and 20, are stacked on the first component 10 in the first embodiment to increase the density of the components per unit area.

The metal pads of the first and fourth components 10 and 70 correspond to each other, and the electric conductive bump 25 electrically connects the first component 10 and the fourth component 70. The invention can stack not only four components but also six, eight, and ten components.

Figure 5:
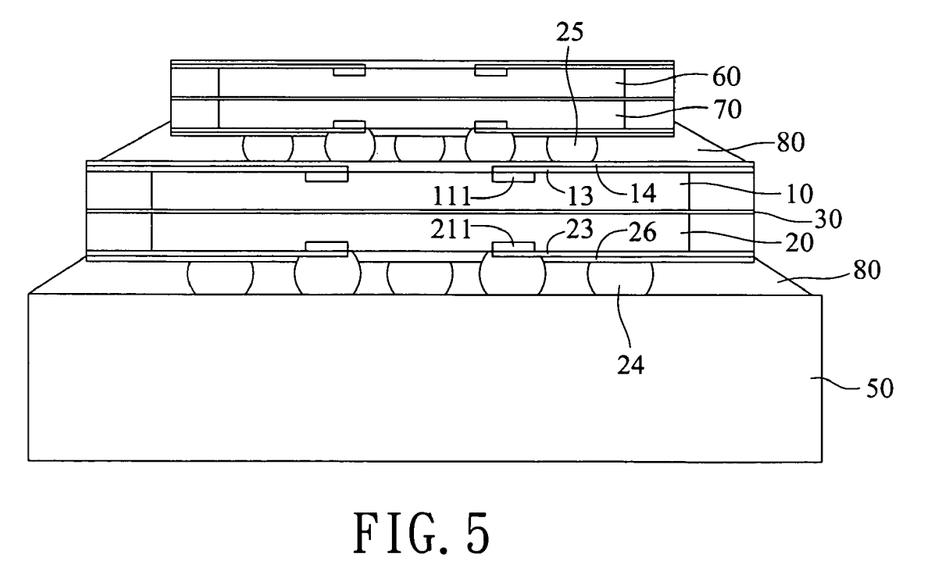
FIG. 5 shows a cross sectional view of a 3-D stackable semiconductor package as a fourth embodiment of the invention.

In FIG. 5 illustrates a cross-sectional view of a 3-D stackable semiconductor package as a fourth embodiment of the invention. The third and fourth components 60 and 70 are smaller than the first and second components 10 and 20, which means the invention can stack components with different sizes or different functions.

The electric conductive bumps 24 and 25 are covered by the underfill 80 for protection.

Figure 6A:
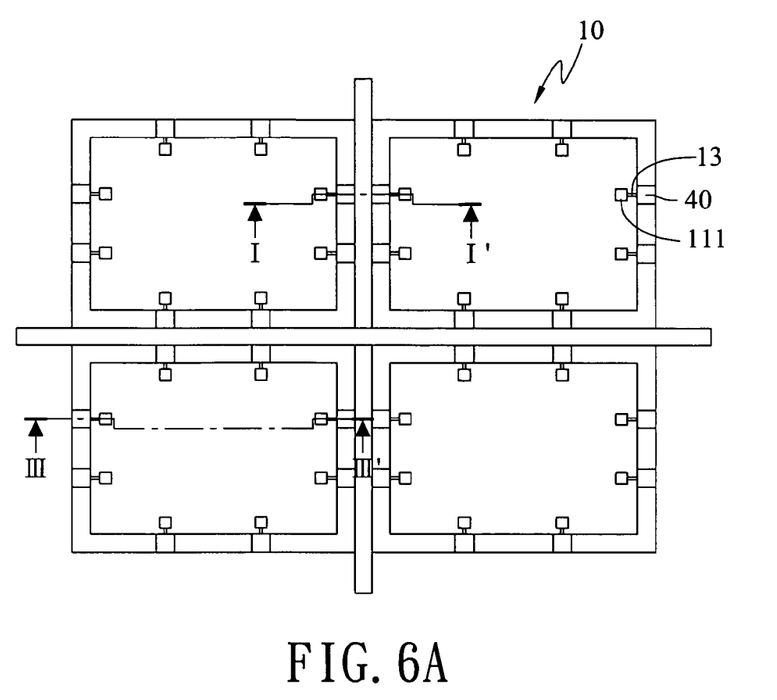
FIG. 6A illustrates a perspective view of the first component.
Figure 6B:
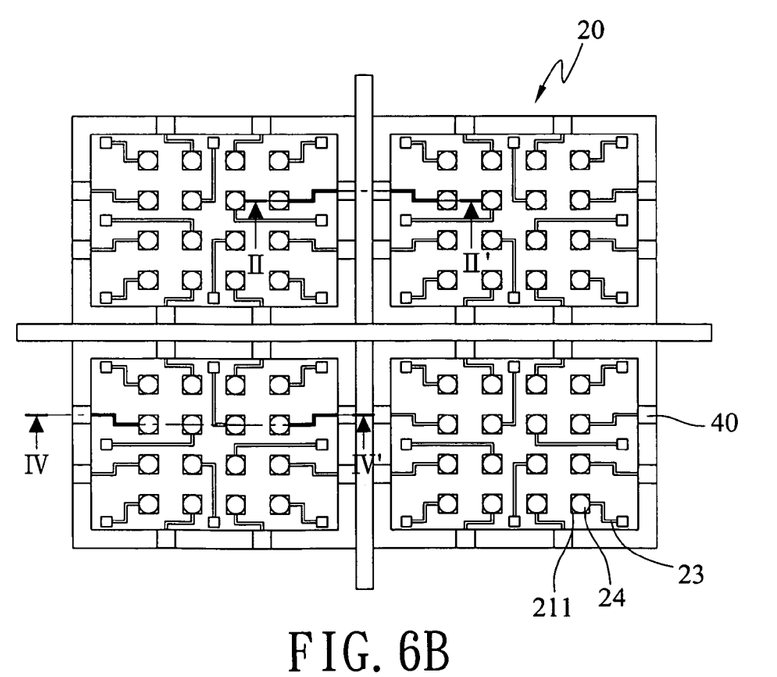
FIG. 6B illustrates a perspective view of the second component.
Figure 7A:
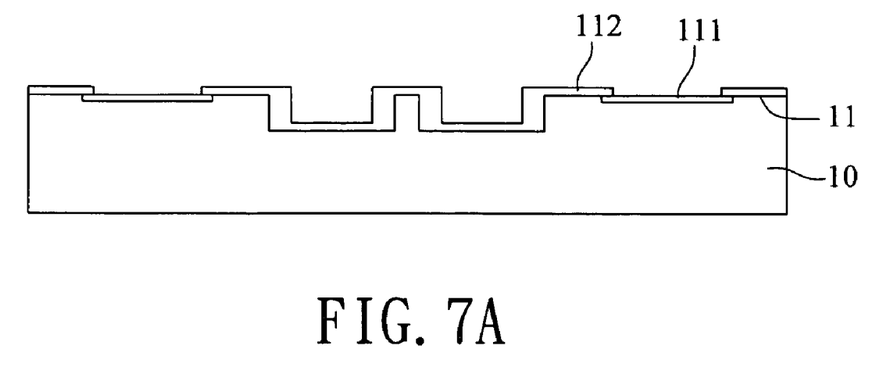
FIGS. 7A to 7C show the fabrication process of the first component 10 before the bonding of the first and second components according to the first embodiment of the invention.
Figure 7B:
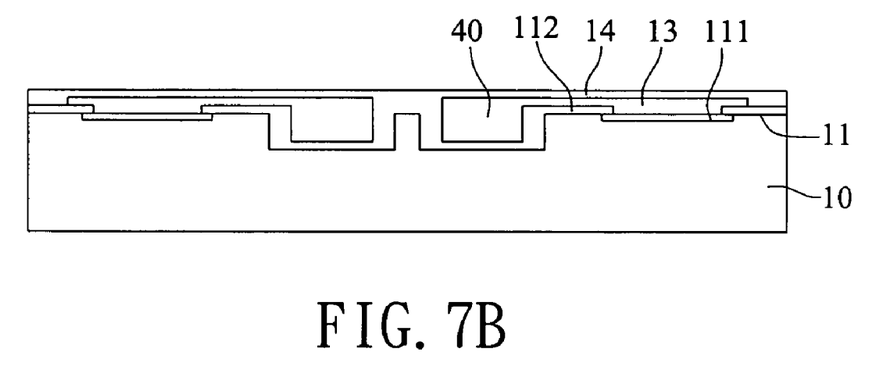
Figure 7C:
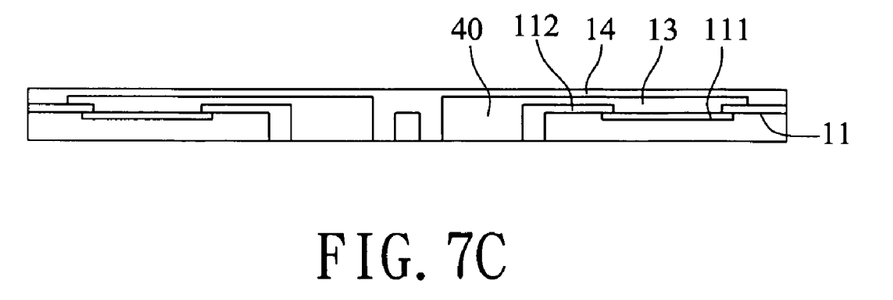
Figure 8A:
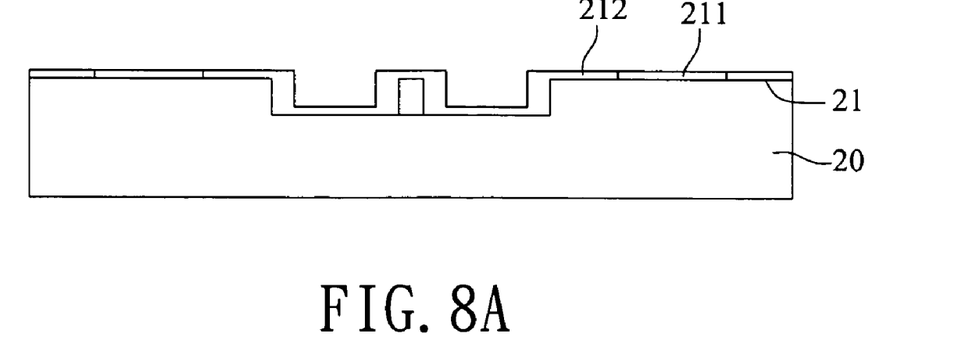
FIGS. 8A to 8C illustrate the fabrication process of the second component 20 before the bonding of the first and second components according to the first embodiment of the invention.
Figure 8B:
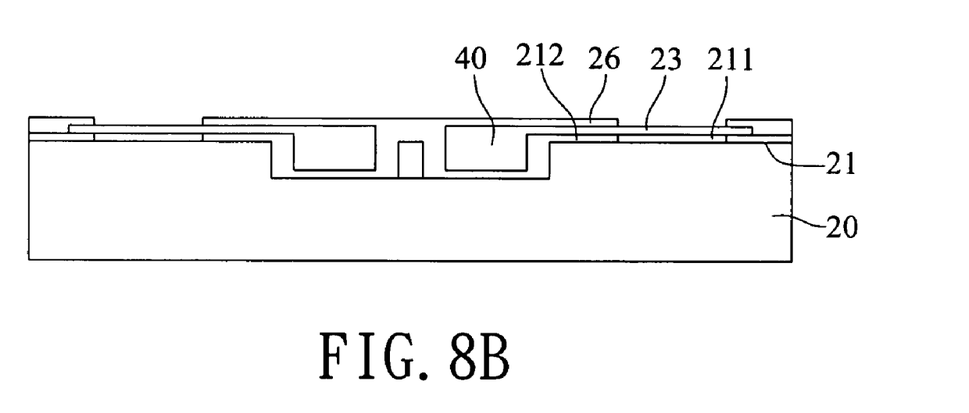
Figure 8C:
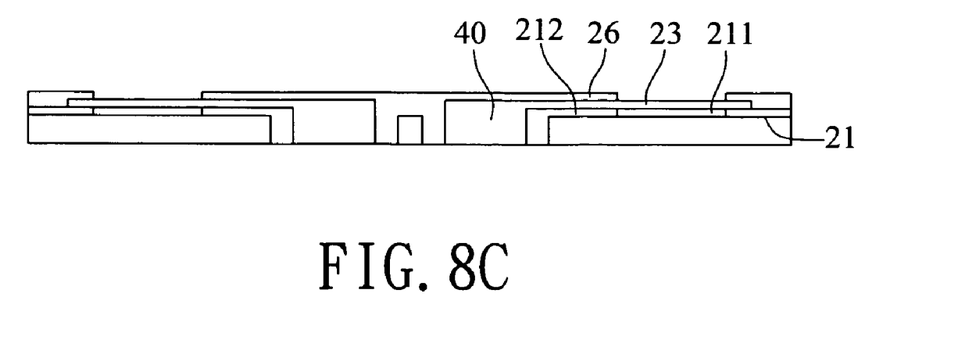

FIGS. 7A to 7C illustrate the fabrication process of the first component 10 before the bonding of the first and second components according to the first embodiment of the invention, wherein the first component 10 is viewed from the side taken along line I–I' in FIG. 6A. FIGS. 8A to 8C illustrate the fabrication process of the second component 20 before the bonding of the first and second components according to the first embodiment of the invention, wherein the second component 20 is viewed from the side taken along line II–II' in FIG. 6B. FIGS. 9A to 9D illustrate the fabrication process of the first and second components 10 and 20 after the bonding of two components according to the first embodiment of the invention, wherein the first component 10 is viewed from the side taken along line I–I' in FIG. 6A and the second component 20 is viewed from the side taken along line II–II' in FIG. 6B. The first and second components 10 and 20 are wafers.

In FIG. 7A, the first metal pad 111 is formed on the first top surface 11 of the first component 10, and a groove 41 is formed at the edge of the first top surface 11 to accommodate the electric conduction post 40. Then, an insulating layer 112 is formed that exposes the first metal pad 111. In FIG. 8A, the second metal pad 211 is formed on the second top surface 21 of the second component 20, and a groove 41 is formed at the edge of the second top surface 21 to accommodate the electric conduction post 40. Then, an insulating layer 212 is formed that exposes the second metal pad 211.

Then, in FIG. 7B, the first redistribution layer 13 and the electric conduction post 40 are formed on the first component 10 by electroplating or sputtering to distribute the first metal pad 111 to the electric conduction post 40, and the first protecting layer 14 is deposited. In FIG. 8B, the second redistribution layer 23 and the electric conduction post 40 are formed on the second component 20 by electroplating or sputtering to distribute the second metal pad 211 to the electric conduction post 40, and the second protecting layer 26 is deposited with an opening for the electric conductive bump 24.

In FIG. 7C, rub the back of the first component 10 to thin and level the first component 10 and expose the electric conduction post 40. Similarly, in FIG. 8C, rub the back of the second component 20 to thin and level the second component 20 and expose the electric conduction post 40.

Figure 9A:
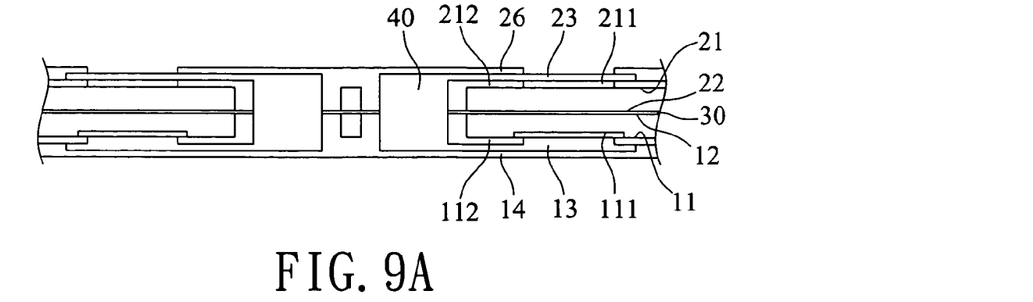
FIGS. 9A to 9D illustrate a fabrication process after combining the first component with the second component.

In FIG. 9A, attach the first bottom surface 12 of the first component 10 to the second bottom surface 22 of the second component 20 with adhesive material, with the electric conduction post 40 electrically connecting the two components.

Figure 9B:
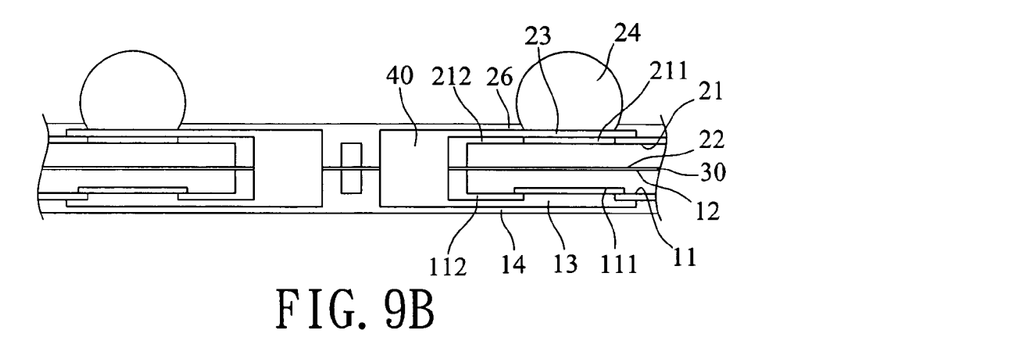
Figure 9C:
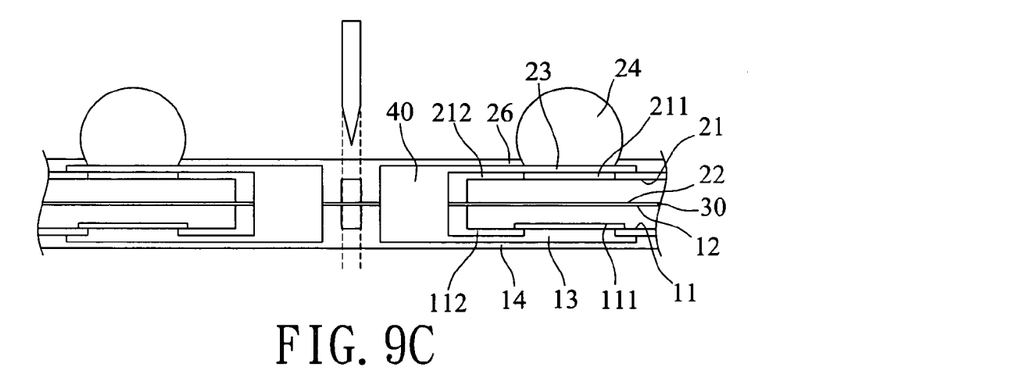
Figure 9D:
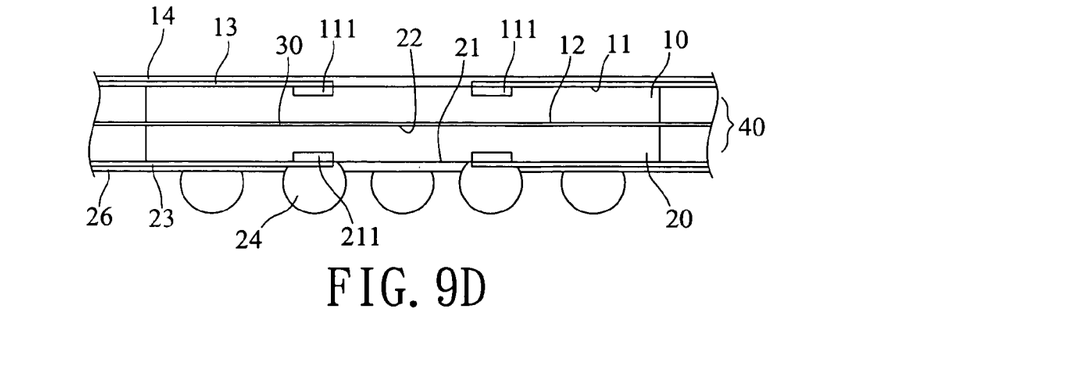

In FIG. 9B, the electric conductive bump 24 corresponding to the second metal pad 211 is formed on the second component 20. In FIG. 9C, cut the wafer to form the 3-D stackable semiconductor package as shown in FIG. 9D. FIG. 9D illustrates a cut die with the first component 10 taken along the line III–III' in FIG. 6A and the second component 20 taken along the line IV–IV' in FIG. 6B.

FIGS. 10A to 10G illustrate another fabrication process according to the first embodiment of the invention.

Figure 10A:
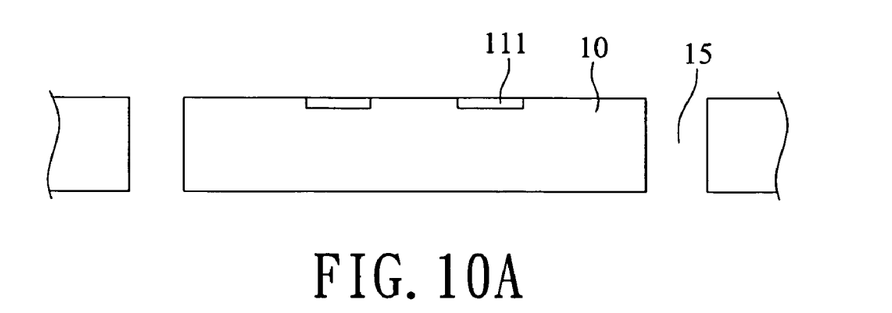
FIGS. 10A to 10F illustrate another fabrication process according to the first embodiment of the invention.

In FIG. 10A, the first component 10 is thinned by rubbing, and it forms an aperture 15 to contain the electric conduction post 40.

Figure 10B:
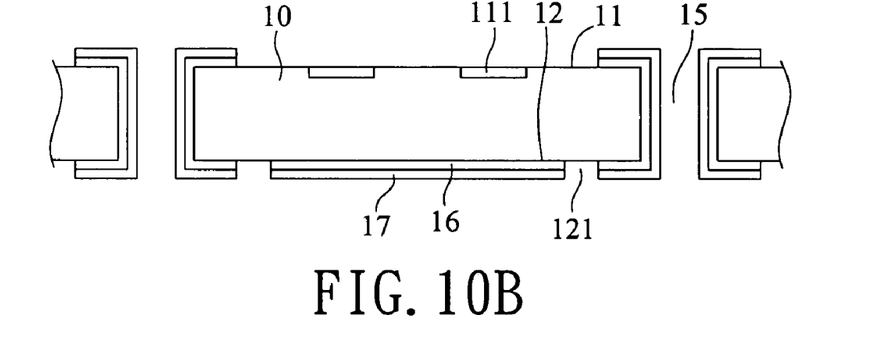

As shown in FIG. 10B, expose the area corresponding to the first metal pad 111 and the first redistribution layer 13 on the first top surface 11 of the first component 10, and form a plurality of openings 121 on the first bottom surface 12 to prevent shortage.

Just like the first component 10, the second component 20 also undergoes the fabrication process as shown in FIGS. 10A to 10B.

Figure 10C:
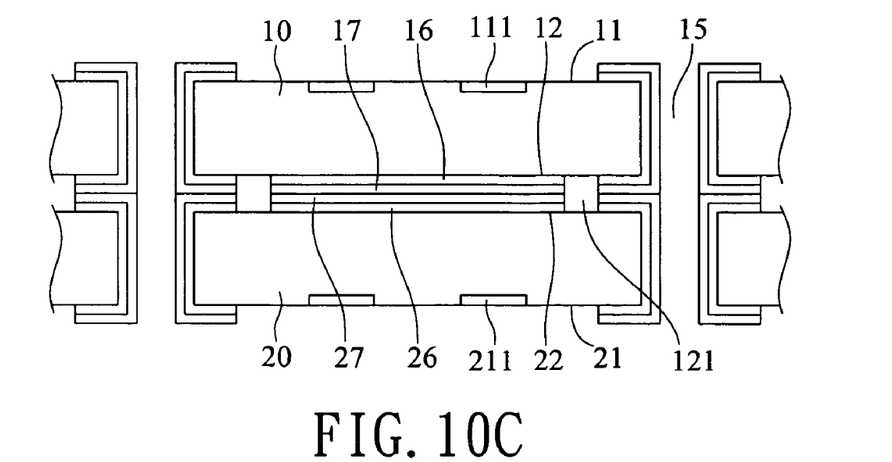

Then, in FIG. 10C, bond the first component 10 with the second component 20 back to back. That is, bond the metal layer 17 of the first component 10 with the metal layer 27 of the second component 20 by hot-pressing or other suitable method. If there is no metal layer disposed on the components, bond the insulating layers of two components.

Figure 10D:
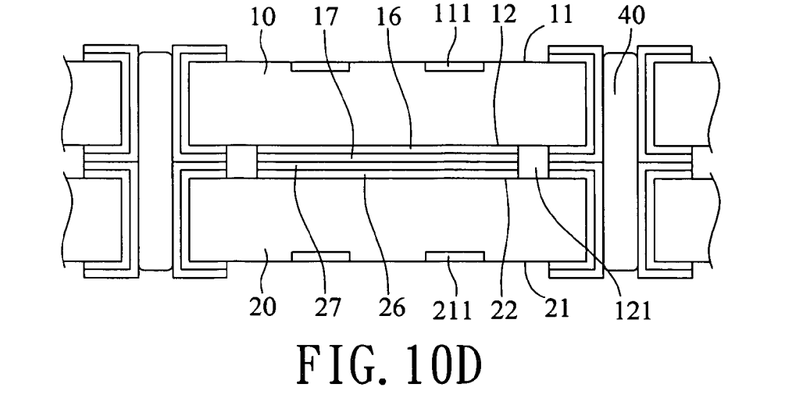

In FIG. 10D, the aperture 15 is filled with metal to serve as the electric conduction post 40.

Figure 10E:
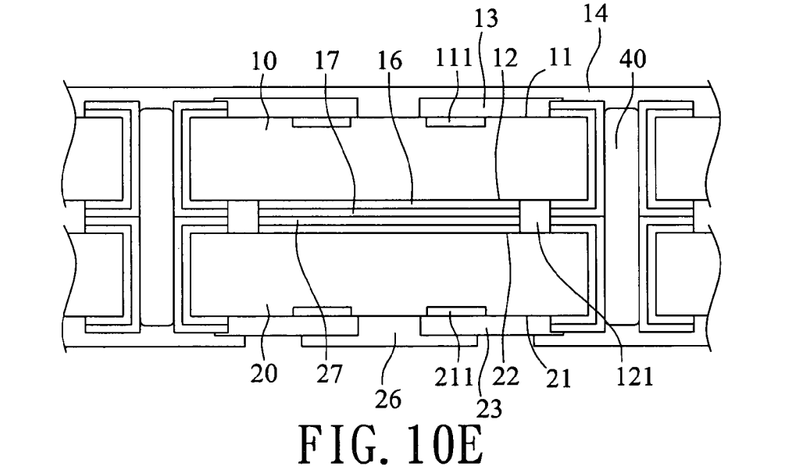

In FIG. 10E, a first redistribution layer 13 and a first protecting layer 14 are sequentially formed on the first top surface 11 of the first component 10, and a second redistribution layer 23 and a second protecting layer 26 are sequentially formed on the second top surface 21 of the second component 20. A plurality of openings is arranged on the second protecting layer 26 to form the electric conductive bumps 24.

Figure 10F:
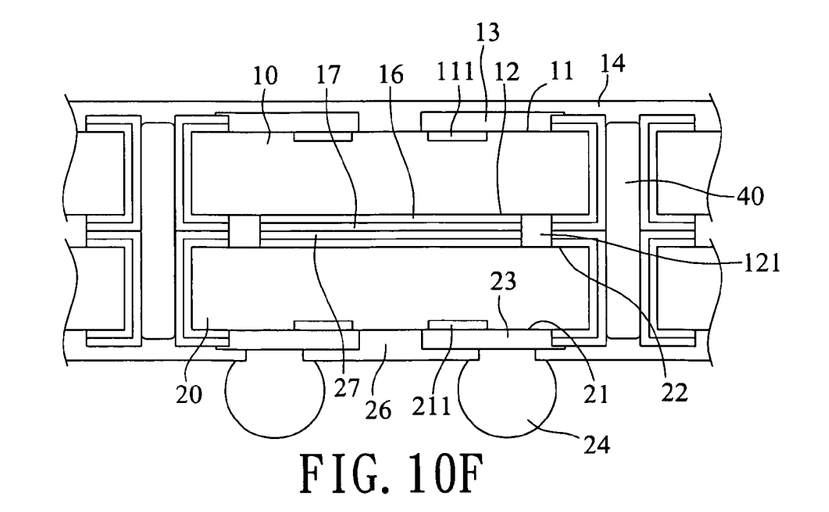

Finally, in FIG. 10F, the electric conductive bumps 24 are formed on the openings of the second protecting layer 26 of the second component 20. Thereby, the 3-D stackable semiconductor package is fabricated.

The two fabrication processes as stated above are only intended to serve as examples. Other fabrication processes within the spirit and scope of the invention are applicable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A 3-D stackable semiconductor package, comprising:
    a first component having a first top surface and a first bottom surface corresponding to each other, said first top surface having at least one first metal pad connected to the edge thereof by a first redistribution layer;
    a second component having a second top surface and a second bottom surface corresponding to each other, said second bottom surface connected to the first bottom surface, so that the first component stacked on the second component, said second top surface having at least one second metal pad, said second metal pad connected to the edge of the second top surface by a second redistribution layer and having a electric conductive bump respectively; and
    an electric conduction post formed at the edge of the first component and the second component to electrically connect the first redistribution layer and the second redistribution layer so as to form a stackable semiconductor package.

2. The package of claim 1, further comprising a first protecting layer disposed on the first top surface.

3. The package of claim 1, further comprising a second protecting layer disposed on the second top surface.

4. The package of claim 1, further comprising an adhesive layer disposed between the first component and the second component for attaching the second bottom surface to the first bottom surface.

5. The package of claim 4, wherein the adhesive layer is made of polymer, metal, or inorganic materials.

6. The package of claim 1, wherein the second top surface further includes at least one cold bump to dissipate heat.

7. The package of claim 1, wherein the first component and the second component are wafers.

8. The package of claim 1, wherein the first component and the second component are dies.

9. The package of claim 1, wherein the first component is a wafer and the second component is a die.

10. The package of claim 1, wherein the first component is a die and the second component is a wafer.

* * * * *